United States Patent
Zhang et al.

(10) Patent No.: US 12,149,159 B2
(45) Date of Patent: Nov. 19, 2024

(54) DRIVING CIRCUIT OF POWER DEVICES, SWITCHING CIRCUIT AND POWER CONVERSION CIRCUIT

(71) Applicant: Delta Electronics (Shanghai) Co., Ltd., Shanghai (CN)

(72) Inventors: Yingqi Zhang, Shanghai (CN); Yao Tao, Shanghai (CN); Baohua Wang, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 199 days.

(21) Appl. No.: 17/812,173

(22) Filed: Jul. 12, 2022

(65) Prior Publication Data

US 2023/0179098 A1 Jun. 8, 2023

(30) Foreign Application Priority Data

Dec. 6, 2021 (CN) .......................... 202111480149.0

(51) Int. Cl.
*H02M 1/088* (2006.01)
*H02M 1/00* (2006.01)

(52) U.S. Cl.
CPC ......... *H02M 1/0064* (2021.05); *H02M 1/088* (2013.01)

(58) Field of Classification Search
CPC ............................................. H02M 1/08–088
See application file for complete search history.

(56) References Cited

U.S. PATENT DOCUMENTS

| 3,553,479 | A | * | 1/1971 | Nelson | .................... | H02M 3/07 |
| | | | | | | 327/482 |
| 2003/0025120 | A1 | * | 2/2003 | Chang | .................... | H05B 45/46 |
| | | | | | | 257/82 |

FOREIGN PATENT DOCUMENTS

| CN | 102497086 A | 6/2012 |
| CN | 105790583 B | 6/2018 |
| CN | 109920619 A | 6/2019 |
| CN | 208956008 U | 6/2019 |
| CN | 111988023 A | 11/2020 |
| CN | 109861506 B | 3/2021 |

* cited by examiner

*Primary Examiner* — Peter M Novak
(74) *Attorney, Agent, or Firm* — CKC & Partners Co., LLC

(57) ABSTRACT

The present application provides a driving circuit of power devices, a switching circuit and a power conversion circuit. The driving circuit is configured to control switching actions of N power devices connected in parallel, where N≥2 and N is a positive integer; the driving circuit includes a driving input circuit and a common magnetic bead, where a first end of the driving input circuit is electrically connected to N first ends of the common magnetic bead, N second ends of the common magnetic bead are electrically connected to control ends of the N power devices in a one-to-one correspondence, and a second end of the driving input circuit is electrically connected to second ends of the N power devices.

19 Claims, 6 Drawing Sheets

DRIVING CIRCUIT OF POWER DEVICES, SWITCHING CIRCUIT AND POWER CONVERSION CIRCUIT

CROSS-REFERENCE TO RELATED APPLICATIONS

This application claims priority to Chinese Patent Application No. 202111480149.0, filed on Dec. 6, 2021, which is hereby incorporated by reference in its entirety.

TECHNICAL FIELD

Embodiments of the present application relate to the field of power device driving technology, and in particular, to a driving circuit of power devices, a switching circuit and a power conversion circuit.

BACKGROUND

To increase output power of a power conversion circuit, a common method is to connect power devices in parallel. Steady-state current sharing and dynamic current sharing of power devices are prerequisites for safe operation of the power devices. Due to a difference in driving circuit parameters of the power devices and a difference in switching characteristics of the power devices, switching moments of the power devices connected in parallel are different, and a power device with an early turn-on bears a larger turn-on current, while a power device with a delayed turn-off bears a larger turn-off current, which increases a switching loss of the power device, and the power device has a risk of overheating or even being damaged.

Therefore, it is necessary to develop a driving circuit of power devices, a switching circuit, and a power conversion circuit to solve a problem faced by the prior art.

SUMMARY

An object of the present application is to provide a driving circuit of power devices, a switching circuit, and a power conversion circuit, which can reduce a risk of the power devices overheating or being damaged.

In a first aspect, the present application provides a driving circuit of power devices, where the driving circuit is configured to control switching actions of N power devices, where N≥2 and N is a positive integer, each power device is provided with a first end, a second end and a control end, first ends of the N power devices are electrically connected to a first node, and second ends of the N power devices are electrically connected to a second node; the driving circuit includes a driving input circuit and a common magnetic bead, the driving input circuit is provided with a first end and a second end, the common magnetic bead is provided with N first ends and N second ends; where the first end of the driving input circuit is electrically connected to the N first ends of the common magnetic bead, the N second ends of the common magnetic bead are electrically connected to control ends of the N power devices in a one-to-one correspondence, and the second end of the driving input circuit is electrically connected to second ends of the N power devices.

In a second aspect, the present application provides a switching circuit, including a driving circuit involved in the first aspect and optional solutions, and N power devices, where N≥2 and N is a positive integer; where the driving circuit is configured to control switching actions of the N power devices; first ends of the N power devices are electrically connected to a first node to form a first end of the switching circuit, and second ends of the N power devices are electrically connected to a second node to form a second end of the switching circuit.

In a third aspect, the present application provides a power conversion circuit, including an input capacitor, a first switching circuit and a second switching circuit, the first switching circuit and the second switching circuit are both the switching circuit involved in the second aspect; where a first end of the first switching circuit is electrically connected to a first end of the input capacitor, a second end of the first switching circuit is electrically connected to a first end of the second switching circuit, and a second end of the second switching circuit is electrically connected to a second end of the input capacitor.

BRIEF DESCRIPTION OF DRAWINGS

Accompanying drawings herein are incorporated into the description and constitute a part of the description, which show embodiments that conform to the present application, and are used together with the description to explain the principle of the present application.

Figure 1:
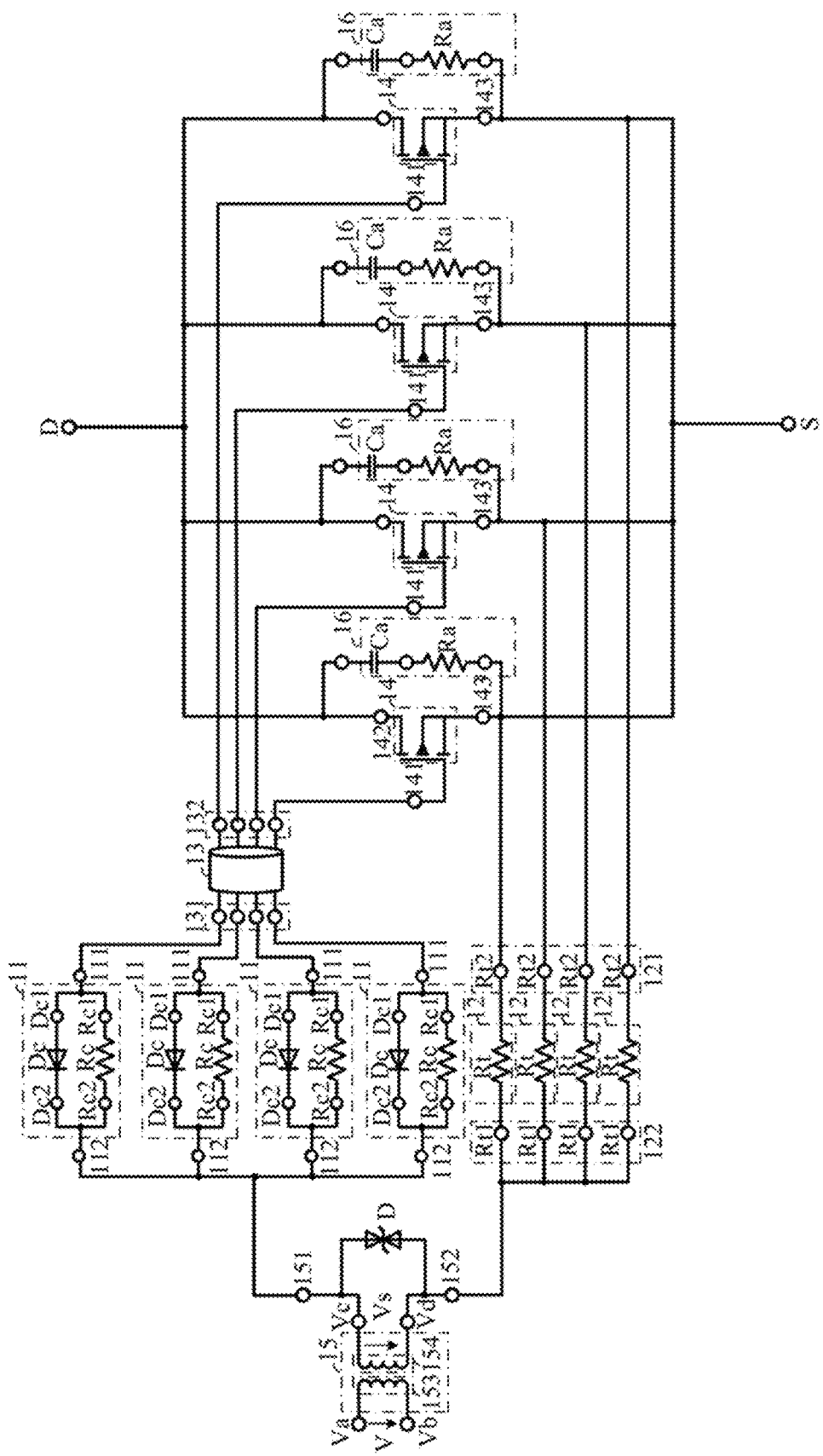
FIG. 1 is a schematic structural diagram of a driving circuit provided by an embodiment of the present application.

Through the above-mentioned accompanying drawings, specific embodiments of the present application have been shown, and will be described in more detail below. These accompanying drawings and text descriptions are not intended to limit the scope of the concept of the present application in any way, but to explain the concept of the present application to those skilled in the art by referring to specific embodiments.

DESCRIPTION OF EMBODIMENTS

Illustrative embodiments will be described here in detail, examples of which are shown in the accompanying drawings. When the following description refers to the accompanying drawings, same numbers in different accompanying drawings indicate same or similar elements unless otherwise indicated. The embodiments described in the following illustrative embodiments do not represent all embodiments consistent with the present application. Instead, they are only examples of apparatuses and methods that are consistent with some aspects of the present application as detailed in the accompanying claims.

A driving circuit of power devices is a circuit that controls on and off of the power device. Connecting multiple power devices in parallel is a way to increase output power of power devices. However, steady-state current sharing and dynamic current sharing of the power devices are prerequisites for safe operation of the power devices, that is, a current difference of the power devices must be suppressed within a small range. Due to a difference in driving circuit parameters (including parasitic parameters) and switching characteristics of the power devices, switching moments of the power devices connected in parallel are different, and a power device with an early turn-on bears a larger turn-on current, while a power device with a delayed turn-off bears a larger turn-off current, which increases a switching loss of the power devices, and the power devices have a risk of overheating or even being damaged. To obtain a good current sharing characteristic, driving circuit parameters of the power devices connected in parallel must have a small tolerance, and circuit wiring should be as symmetrical and consistent as possible, so that the driving differences are limited to a small range.

Taking metal-oxide-semiconductor field-effect transistor (MOSFET) parallel operation as an example, control ends of MOSFETs are driven by a transformer, and a secondary winding of the transformer provides an isolated driving voltage with a negative voltage. In a MOSFET switching process, high voltage change rate (dv/dt) stress and current change rate (di/dt) stress will be generated. In addition, due to a parasitic capacitance of the MOSFET and a parasitic inductance of the driving circuit, a high-frequency oscillation will be generated at the control end. This oscillation may cause overvoltage or false turn-on of the control end, and cause damage to the power device in a severe case.

In order to suppress the high-frequency oscillation at the control end, a magnetic bead is usually added to the control end of each MOSFET, inductance and resistance values of the magnetic bead vary with change of a frequency of current. As the frequency increases, for example, from a low frequency to tens of megahertz, the inductance value of the magnetic bead decreases from several hundreds of nH to a few nH. As the frequency increases, the resistance value of the magnetic bead increases from milliohms to tens of ohms, or even hundreds of ohms. When the frequency is further increased to a hundred megahertz, the magnetic bead behaves as capacitive. A characteristic curve of the resistance and inductance values of the magnetic bead with a change of frequency depending on the magnetic core material, and an appropriate magnetic core material may be selected according to requirements. In an embodiment, the magnetic core material is ferrite.

In a high-frequency band, the magnetic bead may be equivalent to a larger resistor, and its inductance may be ignored, thus effectively reducing a current amplitude when the power device generates a high-frequency oscillation. In a low-frequency band, the magnetic bead is equivalent to an inductor and a small resistor, which has less delay effect on a control end signal. Therefore, choosing a magnetic bead with a small inductance and a large resistance is beneficial to suppress the oscillation at the control end and reduce the delay.

Generally, a tolerance of the inductance of the magnetic bead is about 20%, due to the difference in the parasitic inductance between the magnetic beads electrically connected to the control ends of respective MOSFETs, which may cause different delays between the driving signals of respective control ends, a MOSFET with a large inductance of the magnetic bead will turn off with a delay.

For example, when an inductance value of a magnetic bead electrically connected to a control end of a first MOSFET is less than an inductance value of a magnetic bead electrically connected to a control end of a second MOSFET, a driving signal of the control end of the first MOSFET is earlier than a driving signal of the control end of the second MOSFET when turned off, which causes the second MOSFET to be turned off later than the first MOSFET, so that a turn-off current of the second MOSFET is larger than a turn-off current of the first MOSFET.

Therefore, in order to suppress the high-frequency oscillation of the control end current of the power device, a magnetic bead is added to the control end of each MOSFET. However, the parasitic inductance generated by each magnetic bead is different, which will cause the switching moments of the power devices to be not consistent, and the current sharing between the power devices may not be realized, which will easily lead to an increase in switching loss and an increase in the risk of damage.

In view of the above technical problems, an embodiment of the present application provides a driving circuit of power devices, a switching circuit, and a power conversion circuit, which are intended to solve the problem that current sharing of the power devices due to an addition of a magnetic bead at the control end of each transistor, respectively. The technical idea of the present application is to electrically connect each power device to a same common magnetic bead, and owing to the electrical connection to the common magnetic bead, a parasitic inductance introduced by the magnetic bead is the same for the control end of each power device, which can eliminate the problem of different parasitic inductances introduced by different magnetic beads for the control ends of respective power devices. Therefore, it is ensured that switching moments of the power devices connected in parallel are the same, that is, the current sharing between the power devices is ensured, thereby reducing the switching loss and the risk of damage generated during the switching of the power devices.

FIG. 1 is a schematic structural diagram of a driving circuit provided by an embodiment of the present application. As shown in FIG. 1, each of N power devices 14 is provided with a first end 142, a second end 143 and a control end 141. First ends 142 of the N power devices 14 are electrically connected to a first node D, second ends 143 of the N power devices are electrically connected to a second node S. A driving circuit is electrically connected to control ends 141 and the second ends 143 of the N power devices 14, which is configured to control switching actions of the N power devices 14, and the driving circuit includes a driving input circuit 15 and a common magnetic bead 13. Wherein N≥2 and N is a positive integer, for example, n=4, the present application does not limit the value of the number N.

The driving input circuit 15 is provided with a first end 151 and a second end 152, the common magnetic bead 13 is provided with N first ends 131 and N second ends 132. The first end 151 of the driving input circuit 15 is electrically connected to the N first ends 131 of the common magnetic bead 13, the N second ends 132 of the common magnetic bead 13 are electrically connected to the control ends 141 of the N power devices 14 in a one-to-one correspondence, and the second end 152 of the driving input circuit 15 is electrically connected to the second ends of the N power devices.

The first end 151 of the driving input circuit 15 is electrically connected to the N first ends 131 of the common magnetic bead 13, which means that, the first end 151 of the driving input circuit 15 and the N first ends 131 of the common magnetic bead 13 are directly electrically connected by connecting wires, or, the first end 151 of the driving input circuit 15 and the N first ends 131 of the common magnetic bead 13 are electrically connected to each other through a number of impedance devices. It is worth noting that the electrical connection in the present application may refer to a direct electrical connection, or may refer to an indirect electrical connection through other electronic devices.

The N second ends 132 of the common magnetic bead 13 are electrically connected to the control ends 141 of the N power devices 14 in a one-to-one correspondence, which means that, the N second ends 132 of the common magnetic bead 13 and the control ends 141 of the N power devices 14 are electrically connected in a one-to-one correspondence by connecting wires, and specifically, one second end 132 of the common magnetic bead 13 is electrically connected to the control end 141 of one corresponding power device 14 by a connecting wire. Or, the N second ends 132 of the common magnetic bead 13 and the control ends 141 of the N power devices 14 are electrically connected in a one-to-one correspondence through a number of impedance devices, and specifically, one second end 132 of the common magnetic bead 13 is electrically connected to the control end 141 of one corresponding power device 14 through a number of impedance devices.

The second end 152 of the driving input circuit 15 is electrically connected to the second ends of the N power devices, which means that, the second end 152 of the driving input circuit 15 and the second ends of the N power devices are electrically connected by connecting wires, or the second end 152 of the driving input circuit 15 and the second ends of the N power devices are electrically connected through a number of impedance devices.

The driving input circuit 15 is configured to provide a driving signal, and since the common magnetic bead may be equivalent to a larger resistor in a high-frequency band and its inductance may be ignored, which may effectively reduce a high-frequency oscillation current generated by the power devices 14 when they perform switching actions under the driving signal. The common magnetic bead 13 may be equivalent to an inductor and a resistor of a very small resistance value in a low-frequency band, which has a smaller delay effect on the driving signal at the control end, and the adding of the common magnetic bead 13 does not affect the switching actions of the N power devices.

In addition, the control end 141 of each power device 14 is electrically connected to the same common magnetic bead 13, that is, lead wires of the control ends 141 of respective power devices 14 pass through the same common magnetic bead 13. Since only one common magnetic bead 13 is used, a parasitic inductance introduced by the common magnetic bead 13 is the same for the control end 141 of each power device 14. By the present setup, the problem of different parasitic inductances introduced by different magnetic beads electrically connected to the control ends 141 of respective power devices 14 can be eliminated.

In the above technical solution, the driving circuit is configured to provide driving signals to the power devices 14 which operate in parallel to achieve a high-power output. The driving input circuit 15 is configured to provide the driving signals. By electrically connecting the common magnetic bead 13 to the control end 141 of each power device 14, and by using the characteristic that the impedance of the common magnetic bead 13 increases with an increase of frequency, the current amplitude when the power devices 14 generate a high-frequency oscillation may be effectively suppressed, thereby suppressing the high-frequency oscillation at the control end. By electrically connecting the control end 141 of each power device 14 to the same common magnetic bead 13, the problem of different parasitic inductances introduced by electrically connecting to different magnetic beads can be eliminated. Therefore, it is ensured that switching moments of the power devices 14 connected in parallel are the same, that is, the current sharing between the power devices is ensured, thereby reducing the switching loss and the risk of damage generated during the switching of the power devices 14, and improving the safety of the power devices 14 during operation.

In an embodiment, continuing to refer to FIG. 1, the driving circuit further includes an impedance circuit, and the impedance circuit is electrically connected between the driving input circuit 15 and the N power devices 14. The impedance circuit includes N first impedance circuits 11 and N second impedance circuits 12. The number of the first impedance circuits 11 is the same as the number of the power devices 14, and the number of second impedance circuits 12 is also the same as the number of power devices 14. For example, when the number of power devices 14 is four, the number of the first impedance circuits 11 and the number of the second impedance circuits 12 are both four.

In the driving circuit, each first impedance circuit 11 is provided with a first end 111 and a second end 112. The first end 151 of the driving input circuit 15 is electrically connected to the second ends 112 of the N first impedance circuits 11. The first ends 111 of the N first impedance circuits 11 are electrically connected to the N first ends 131 of the common magnetic bead 13 in a one-to-one correspondence, and specifically, the first end 111 of one first impedance circuit 11 is electrically connected to one corresponding first end 131 of the common magnetic bead 13. The first impedance circuit 11 is configured to regulate the current in the driving circuit, so as to protect the control ends 141 of the power devices 14 from being breakdown by a high current in the driving circuit.

Each second impedance circuit 12 is provided with a first end 121 and a second end 122, and the second end 152 of the driving input circuit 15 is electrically connected to the second ends 122 of the N second impedance circuits 12, that is, all the second ends 122 of the N second impedance circuits 12 are electrically connected to the second end 152 of the driving input circuit 15. The second impedance circuit 12 is also configured to regulate the current in the driving circuit, so as to protect the control ends 141 of the power devices 14 from being breakdown by a high current in the driving circuit.

The N second ends 132 of the common magnetic bead 13 are used as first driving ends of the driving circuit for electrically connecting to the control ends 141 of the N power devices 14 in a one-to-one correspondence, and specifically, one second end 132 of the common magnetic bead 13 is electrically connected to the control end 141 of one corresponding power device 14. The first ends 121 of the N second impedance circuits 12 are used as second driving ends of the driving circuit for electrically connecting to the second ends 143 of N power devices 14 in a one-to-one correspondence, and specifically, the first end 121 of one second impedance circuit 12 is electrically connected to the second end 143 of one corresponding power device 14. By the present setup, the driving circuit can provide driving signals to the N power devices 14, so that switching moments of the N power devices 14 are the same, and current sharing of the devices can be realized.

It should also be noted here that, in the present embodiment, the impedance circuit includes N first impedance circuits 11 and N second impedance circuits 12. In another embodiment, the impedance circuit may include only N first impedance circuits 11 which are electrically connected to the control ends of the N power devices 14, and not include the second impedance circuits 12. It is also possible to include only N second impedance circuits 12 which are electrically connected to the second ends of the N power devices 14, and not include the first impedance circuits 11.

In the present embodiment, the N first impedance circuits 11 are electrically connected between the driving input circuit 15 and the common magnetic bead 13, and the driving input circuit 15 is electrically connected to the control ends of the N power devices 14 through the N first impedance circuits 11 and the common magnetic bead 13 in turn. In another embodiment, positions of the N first impedance circuits 11 and the common magnetic bead 13 may be interchanged, and the common magnetic bead 13 is electrically connected between the driving input circuit 15 and the N first impedance circuits 11, and the driving input circuit 15 is electrically connected to the control ends of the N power devices 14 through the common magnetic bead 13 and the N first impedance circuits 11 in turn. Specifically, the first end 151 of the driving input circuit 15 is electrically connected to the N first ends 131 of the common magnetic bead 13, and the N second ends 132 of the common magnetic bead 13 are electrically connected to the second ends 112 of the N first impedance circuits 11 in a one-to-one correspondence. The first ends 111 of the N first impedance circuits 11 are used as the first driving ends of the driving circuit for electrically connecting to the control ends 141 of the N power devices 14 in a one-to-one correspondence.

When the impedance circuit only includes N first impedance circuits 11 but does not include second impedance circuit, the N first impedance circuits 11 may be connected to the common magnetic bead 13 in the same manner as in the above embodiment, which will not be repeated here. In this case, the second end 152 of the driving input circuit 15 is used as the second driving end of the driving circuit.

When the impedance circuit only includes N second impedance circuits 12 but does not include first impedance circuit, the first end 151 of the driving input circuit 15 is electrically connected to the N first ends 131 of the common magnetic bead 13, the N second ends 132 of the common magnetic bead 13 are used as the first driving ends of the driving circuit, the second end 152 of the driving input circuit 15 is electrically connected to the second ends of the N second impedance circuits 12, and the first ends 121 of the N second impedance circuits 12 are electrically connected to the second ends 143 of the N power devices 14 in a one-to-one correspondence, and the first ends 121 of the N second impedance circuits 12 are used as the second driving ends of the driving circuit.

In the above technical solution, the driving circuit is configured to provide driving signals to the power devices 14 which operate in parallel to achieve a high-power output. The driving input circuit 15 is configured to provide the driving signals, and the first impedance circuits 11 and the second impedance circuits 12 are configured to regulate the current in the driving circuit. By electrically connecting the common magnetic bead 13 to the control end 141 of each power device 14, and by using the characteristic that the impedance of the common magnetic bead 13 increases with an increase of frequency, the current amplitude when the power device 14 generates a high-frequency oscillation may be effectively suppressed, thereby suppressing the high-frequency oscillation at the control end. By electrically connecting the control end 141 of each power device 14 to the same common magnetic bead 13, the problem of different parasitic inductances introduced by electrically connecting to different magnetic beads can be eliminated. Therefore, it is ensured that switching moments of the power devices 14 connected in parallel are the same, that is, the current sharing between components is ensured, thereby reducing the switching loss and the risk of damage generated during the switching of the power devices 14, and improving the safety of the power devices 14 during operation.

In an embodiment, the common magnetic bead 13 includes a magnetic core and N coils, where the N coils are all wound on the magnetic core, and first ends of the N coils are used as the N first ends 131 of the common magnetic bead 13, and second ends of the N coils are used as the N second ends 132 of the common magnetic bead 13.

A winding manner of the coils on the magnetic core is as follows: the N coils pass through the magnetic core from the first ends to the second ends in a same winding manner, and ends of the N coils with a same polarity are located on a same side of the magnetic core. By the present setup, when the driving circuit is working, since current directions of the N coils are the same, magnetic field directions generated by the N coils are the same, that is, the N coils are in a positive magnetic coupling relationship. Due to the winding arrangement between the coils, when the driving circuit is working, the common magnetic bead 13 will introduce a parasitic inductance which is the same for the control ends 141 of the N power devices 14.

The magnetic core may be of various shapes, such as toroidal, square, etc. Since the driving signals for the control ends generates magnetic flux in the magnetic core, saturation of the magnetic core should be considered when designing a cross-sectional area of the magnetic core. A magnetic core with air gaps may also be used, for example, using two U-shaped magnetic cores to form a toroidal magnetic core, or using a U-shaped magnetic core and an I-shaped magnetic core to form a toroidal magnetic core.

In an embodiment, the number of the coils is the same as the number of the power devices 14 in the driving circuit, and the number of turns of each coil on the magnetic core is also the same. For example, the lead wire of the control end of each power device is wound one turn on the magnetic core.

In an embodiment, the coils are formed by a wire or a copper foil on a printed circuit board (PCB).

In an embodiment, the power device 14 includes a metal-oxide-semiconductor field-effect transistor (MOSFET), a silicon carbide field-effect transistor (SIC MOSFET), or a gallium nitride (GaN) transistor. When the power device 14 is a field-effect transistor, the first end 142 of the power device 14 is a drain of the MOSFET, the second end 143 of the power device is a source of the MOSFET, and the control end 141 of the power device 14 is a gate of the MOSFET.

In some embodiments, the first impedance circuit 11 includes a control end resistor Rc and a control end diode Dc. As shown in FIG. 1 and FIG. 2A to FIG. 2C, all the N first impedance circuits 11 are the control end resistor Rc and the control end diode Dc connected in parallel. A first end Rc1 of the control end resistor Rc and a first end Dc1 of the control end diode Dc are electrically connected to a node and serve as the first end 111 of the first impedance circuit 11, and a second end Rc2 of the control end resistor Rc and a second end Dc2 of the control end diode Dc are electrically connected to a node and serve as the second end 112 of the first impedance circuit 11. Resistance values of the N control end resistors Rc are equal, and the characteristic parameters of the N control end diodes Dc are equal. It is worth noting that the circuit structure of the first impedance circuit 11 may also be in other forms, for example, the first impedance circuit 11 may only include a resistor but does not include a diode; and may also include electronic devices such as a capacitor. However, it is necessary to ensure that the circuit structures and electrical parameters of the N first impedance circuits 11 are the same, so as to ensure that the parasitic parameters of the corresponding power devices caused by the N first impedance circuits 11 are the same. By the present setup, it is ensured that the synchronization of the driving signal of each power device, which is beneficial to realize current sharing between power devices, thereby reducing the switching loss and the risk of damage generated during the switching of the power devices.

In some embodiments, the second impedance circuit 12 includes a second terminal resistor Rt. Referring to FIG. 1 and FIG. 2A to FIG. 2C, the N second impedance circuits 12 are all second end resistors Rt, a first end Rt2 of the second end resistor Rt is used as the first end 121 of the second impedance circuit 12, and a second end Rt1 of the second end resistor Rt is used as the second end 122 of the second impedance circuit 12. Resistance values of the N second-end resistors Rt are equal. It is worth noting that the circuit structure of the second impedance circuit 12 may also be in other forms, for example, the second impedance circuit 12 may not only include a resistor, but also electronic devices such as a diode and a capacitor. However, it is necessary to ensure that the circuit structures and electrical parameters of the N second impedance circuits 12 are the same, so as to ensure that the parasitic parameters of the corresponding power devices caused by the N second impedance circuits 12 are the same. By the present setup, the synchronization of the driving signal of each power device is ensured, which is beneficial to realize current sharing between power devices, thereby reducing the switching loss and the risk of damage generated during the switching of the power devices.

In an embodiment, the driving input circuit 15 may be provided with a first end 151 and a second end 152. The second end 152 of the driving input circuit 15 is electrically connected to the second ends 122 of the N second impedance circuits 12. As an implementation manner, the first end 151 of the driving input circuit 15 is electrically connected to the second ends 112 of the N first impedance circuits 11. As another implementation manner, the first end 151 of the driving input circuit 15 is electrically connected to the N first ends 131 of the common magnetic bead 13.

The driving input circuit 15 may be a non-isolated driving input circuit or an isolated driving input circuit.

Figure 2A:
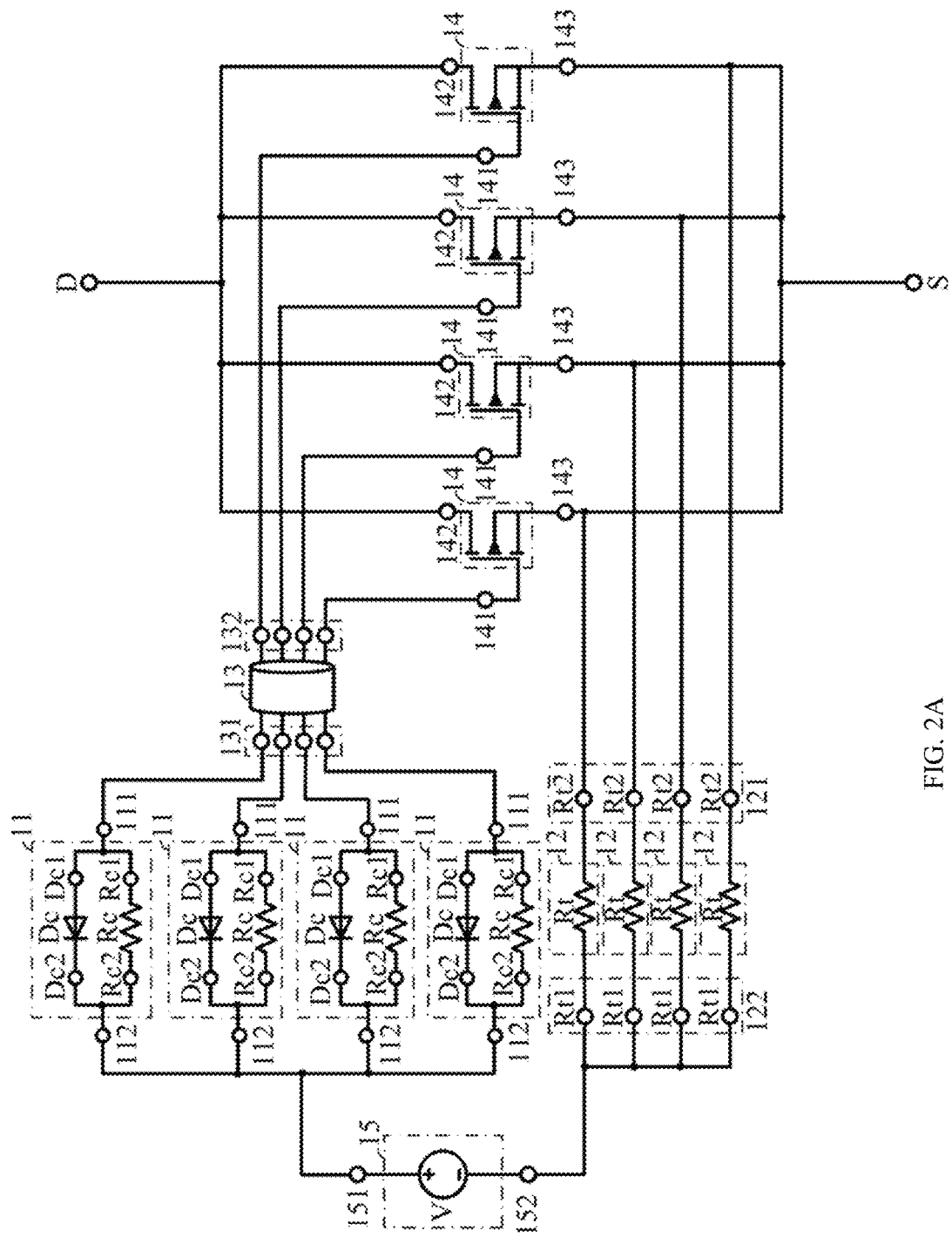
FIG. 2A is a schematic structural diagram of a driving circuit provided by an embodiment of the present application, which shows a first structure of a driving input circuit.

In an embodiment, referring to FIG. 2A, the driving input circuit 15 includes a power supply, that is, the driving input circuit 15 is a non-isolated driving input circuit, and a first end of the power supply is used as the first end 151 of the driving input circuit 15, a second end of the power supply is used as the second end 152 of the driving input circuit 15.

In an embodiment, the driving input circuit 15 includes a power supply and an isolation unit, that is, the driving input circuit 15 is an isolated driving input circuit. Where an input side of the isolation unit is electrically connected to the power supply, an end of the output side of the isolation unit is used as the first end 151 of the driving input circuit 15, and another end of the output side of the isolation unit is used as the second end 152 of the driving input circuit 15. The isolation unit includes any one of a transformer, an optocoupler isolation unit, and an optical fiber isolation unit.

Figure 2B:
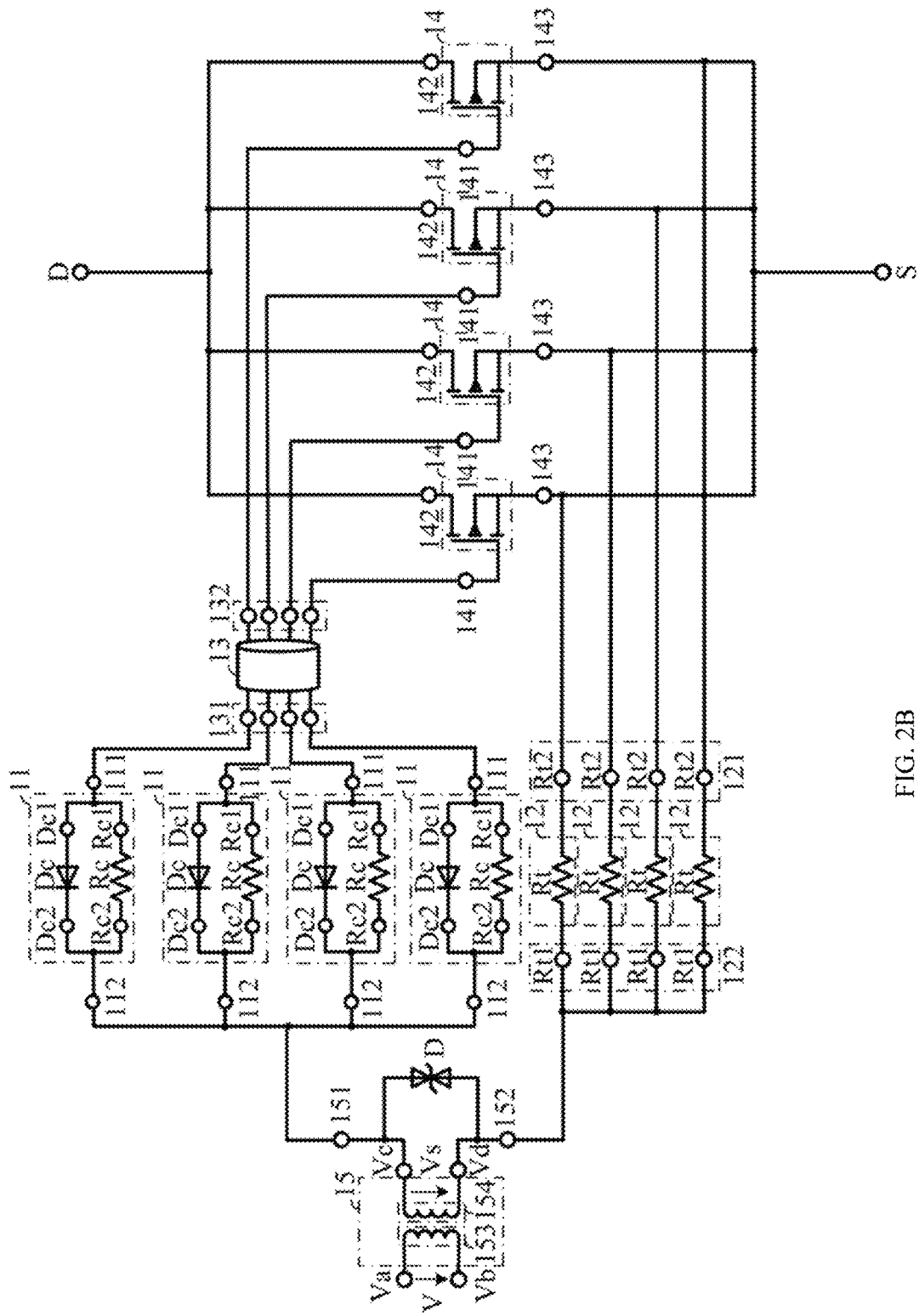
FIG. 2B is a schematic structural diagram of a driving circuit provided by an embodiment of the present application, which shows a second structure of the driving input circuit.

When the isolation unit is a transformer, referring to FIG. 2B, a primary winding 153 of the transformer is electrically connected to the power supply, a first end Vc of a secondary winding 154 of the transformer is used as the first end 151 of the driving input circuit 15, and a second end Vd of the secondary winding 154 of the transformer is used as the second end 152 of the driving input circuit 15. In an embodiment, at a certain moment of the transformer, a voltage of the primary winding is a voltage difference V between a first end Va and a second end Vb of the primary winding, and a voltage of the secondary winding is a voltage difference Vs between the first end Vc and the second end Vd of the secondary winding, where the voltage of the primary winding and the voltage of the secondary winding are determined by the number of turns and the direction of the magnetic flux on the two sides of the transformer. The primary winding and the secondary winding of the transformer are not directly connected electrically, but electrical energy transmission is implemented through a change of magnetic flux of magnetic circuits, thereby achieving electrical isolation.

Figure 2C:
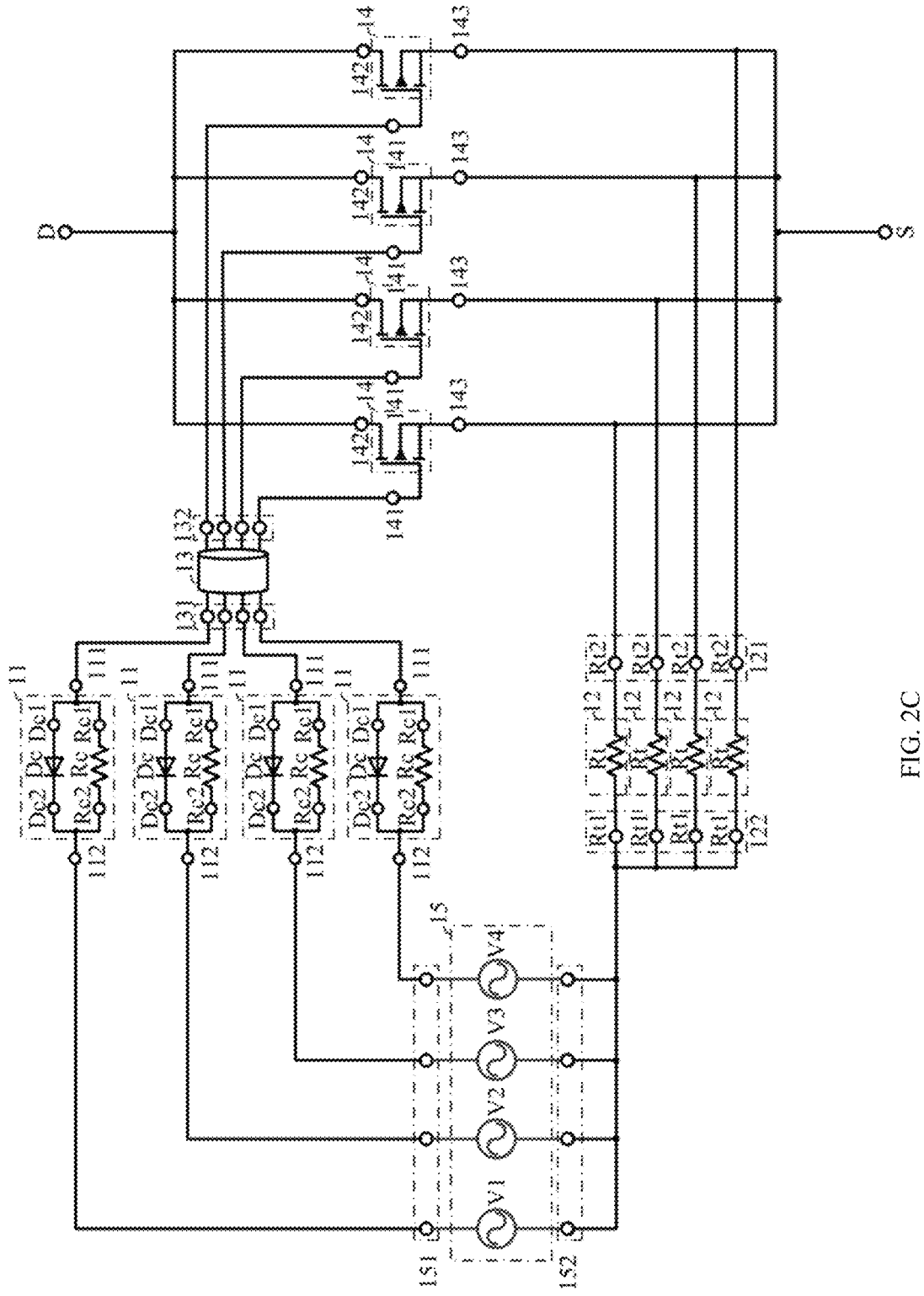
FIG. 2C is a schematic structural diagram of a driving circuit provided by an embodiment of the present application, which shows a third structure of the driving input circuit.

In an embodiment, referring to FIG. 2C, the driving input circuit 15 may be provided with N first ends 151 and N second ends 152. When the driving input circuit 15 has N first ends 151 and N second ends 152, the N second ends 152 of the driving input circuit 15 are electrically connected to a same node and then electrically connected to the second ends 122 of the N second impedance circuits 12. As one of the implementation manners, the N first ends 151 of the driving input circuit 15 are electrically connected to the second ends 112 of the N first impedance circuits 11 in a one-to-one correspondence, and the first ends 111 of the N first impedance circuits 11 are electrically connected the N first ends 131 of the common magnetic bead 13 in a one-to-one correspondence. As another implementation manner, the first ends 151 of the driving input circuit 15 are electrically connected to the N first ends 131 of the common magnetic bead 13 in a one-to-one correspondence, and the N second ends 132 of the common magnetic bead 13 are electrically connected to the second ends 112 of the N first impedance circuits 11 in one-to-one correspondence.

In an embodiment, the driving input circuit 15 includes N power supplies, that is, the driving input circuit 15 is a non-isolated driving input circuit. The first ends of the N power supplies are used as the N first ends 151 of the driving input circuit 15, and the second ends of the N power supplies are used as the N second ends 152 of the driving input circuit 15.

In an embodiment, referring to FIG. 2C, all N power supplies are alternating current power supplies, and output voltages of the N alternating current power supplies have the same amplitude and frequency. For example, the driving input circuit 15 includes four alternating current power supplies, labeled as a first alternating current power supply V1, a second alternating current power supply V2, a third alternating current power supply V3, and a fourth alternating current power supply V4. Negative poles of the first alternating current power supply V1, the second alternating current power supply V2, the third alternating current power supply V3, and the fourth alternating current power supply V4 are electrically connected together and then electrically connected to the second ends 122 of the second impedance circuits 12, and positive poles of the first alternating current power supply V1, the second alternating current power supply V2, the third alternating current power supply V3 and the fourth alternating current power supply V4 are electrically connected to the second ends 112 of the first impedance circuits 11 in a one-to-one correspondence.

In an embodiment, the driving input circuit 15 is an isolated driving input circuit 15. And the driving input circuit 15 includes N power supplies and N isolation units.

Input sides of the N isolation units are electrically connected to the N power supplies in a one-to-one correspondence, an end of an output side of each isolation unit is used as a first end 151 of the driving input circuit 15, and another end of the output side of each isolation unit is used as a second end 152 of the driving input circuit 15. The isolation unit includes any one of a transformer, an optocoupler isolation unit, and an optical fiber isolation unit.

In an embodiment, referring to FIG. 1, the driving circuit further includes a transient diode D, a first end of the transient diode D is electrically connected to the first end 151 of the driving input circuit 15, and a second end of the transient diode D is electrically connected to the second end 152 of the driving input circuit 15. The transient diode D is used to limit the output voltage of the driving input circuit 15, so that the voltage does not exceed a preset voltage value of the transient diode D, thereby protecting the driving circuit from being affected by a voltage fluctuation of the input power supply and preventing circuit damage.

In an embodiment, continuing to refer to FIG. 1, the driving circuit further includes N absorption circuits 16, and first ends of the N absorption circuits 16 are electrically connected to the first ends 142 of the N power devices 14 in a one-to-one correspondence, and second ends of the N absorption circuits 16 are electrically connected to the second ends 143 of the N power devices 14 in a one-to-one correspondence. More specifically, the number of absorption circuits 16 is the same as the number of the power devices, for example, when the number of the power devices 14 is four, the number of the absorption circuits 16 is four.

Each absorption circuit 16 includes an absorption capacitor Ca and an absorption resistor Ra. A first end of the absorption capacitor Ca is used as the first end of the absorption circuit 16, a first end of the absorption resistor Ra is electrically connected to a second end of the absorption capacitor Ca, and a second end of the absorption resistor Ra is used as the second end of the absorption circuit 16. The absorption capacitor Ca is used to ensure stability of a voltage difference between the first end 142 and the second end 143 of the power device, and to avoid an excessive voltage level fluctuation resulting in damage to the power device. The absorption resistor Ra is used to avoid damage to the power device caused by excessive current during the discharge of the absorption capacitor Ca.

In the above technical solution, the driving circuit limits the output voltage range of the driving input circuit through the transient diode D connected in parallel with the driving input circuit, to protect the power devices 14 electrically connected to the driving circuit from being affected by a voltage fluctuation of the power supply, and secondly, the first impedance circuit 11 with the same parameters and/or the second impedance circuit 12 with the same parameters are provided, and the common magnetic bead 13 is provided, so that the impedance characteristics of the driving circuit corresponding to the multiple power devices 14 connected in parallel are kept the same, thereby ensuring the current sharing between the multiple power devices 14. In addition, each power device 14 is also connected with an absorption circuit in parallel, thereby ensuring that the voltage on the two ends of the power device does not change abruptly, and protecting the power device from damage.

Figure 1A:
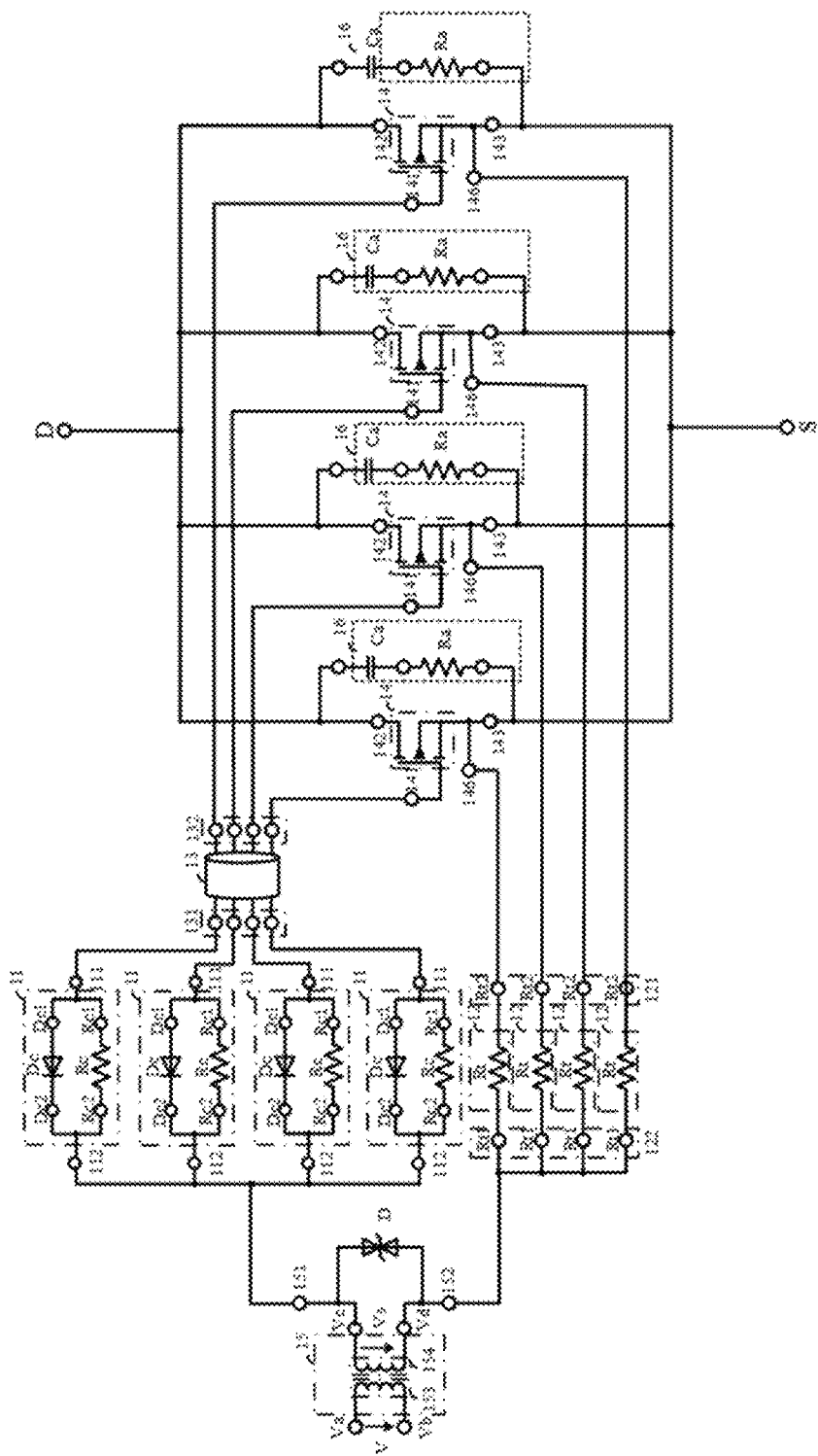
FIG. 1A is another schematic structural diagram of a driving circuit provided by an embodiment of the present application.

In an embodiment, as shown in FIG. 1A, for a power device 14 with four ports, the power device 14 further includes a Kelvin source 146, and inside the power device 14, the Kelvin source 146 is electrically connected to the second end 143. When the power device 14 is electrically connected to the driving circuit, the Kelvin sources 146 of the N power devices are electrically connected to the N second driving ends of the driving circuit in a one-to-one correspondence, that is, the second end of the driving input circuit 15 is indirectly electrically connected to the second ends 143 of the N power devices through the Kelvin sources 146. This electrical connection method can reduce electrical connection resistance and parasitic inductance.

As shown in FIG. 1, an embodiment of the present application further provides a switching circuit, the switching circuit includes a driving circuit and N power devices 14, where N≥2 and N is a positive integer, for example, N=4 in the present embodiment. Control ends 141 of the N power devices 14 are electrically connected to N first driving ends of the driving circuit in a one-to-one correspondence, and second ends 143 of the N power devices are electrically connected to N second driving ends of the driving circuit in a one-to-one correspondence. The driving circuit of the N power devices is configured to provide driving signals for the N power devices 14.

The first ends 142 of the N power devices are electrically connected to the first node D to form a first end of the switching circuit, and the second ends 143 of the N power devices are electrically connected to the second node S to form a second end of the switching circuit, thus the N power devices 14 are connected in parallel to output more power.

Figure 3:
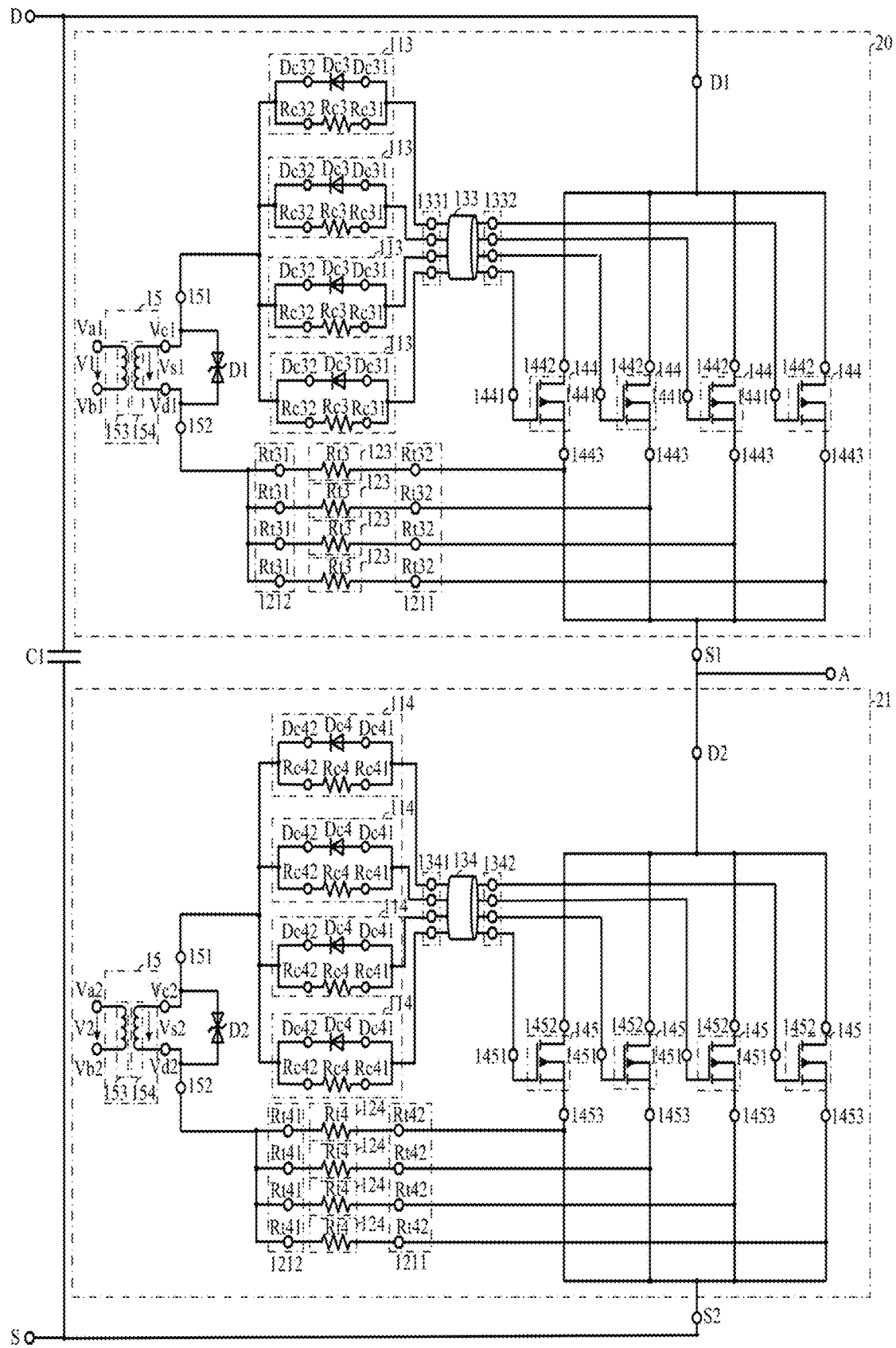
FIG. 3 is a schematic structural diagram of a half-bridge circuit provided by an embodiment of the present application.

FIG. 3 is a schematic structural diagram of a power conversion circuit provided by an embodiment of the present application. As shown in FIG. 3, the circuit includes two switching circuits and an input capacitor C1, where the two switching circuits are labeled as a first switching circuit 20 and a second switching circuit 21. a first end D1 of the first switching circuit 20 is electrically connected to a first end of the input capacitor C1, a second end S1 of the first switching circuit 20 is electrically connected to a first end D2 of the second switching circuit 21, and a second end S2 of the second switching circuit 21 is electrically connected to a second end of the input capacitor, where both the first switching circuit 20 and the second switching circuit 21 are a switching circuit as shown in FIG. 1.

In the following, description is given by taking an example where the first switching circuit and the second switching circuit both include four power devices 14 and the power devices are MOSFETs. Four power devices 144 in the first switching circuit are connected in parallel to form an upper bridge arm switch, a drain of the upper bridge arm switch is drains 1442 of the four power devices 144, and a source of the upper bridge arm switch is sources 1443 of the four power devices 144. Four power devices 145 in the second switching circuit are connected in parallel to form a lower bridge arm switch, a drain of the lower bridge arm switch is drains 1452 of the four power devices 145, and a source of the lower bridge arm switch is sources 1453 of the four power devices 145.

The drain of the upper bridge arm switch is connected to a positive end of a direct current input power supply, that is, the first end of the first switching circuit is connected to the positive end of the direct current input power supply, and the source of the lower bridge arm is connected to a negative end of the direct current input power supply, that is, the second end of the second switching circuit is connected to the negative end of the direct current input power supply. The second end of the first switching circuit is used as the second end of the power conversion circuit. A threshold of MOSFET gate voltage is several volts. When the MOSFET gate voltage is greater than the threshold voltage, the MOSFET is turned on, and when the gate voltage is less than the threshold, the MOSFET is turned off. When the upper bridge arm switch is turned on, the first end of the first switching circuit is connected to the second end of the first switching circuit, and the second end of the power conversion circuit outputs a high level. When the lower bridge arm switch is turned on, the first end of the second switching circuit is connected to the second end of the second switching circuit, and the second end of the power conversion circuit outputs a low level. When the upper bridge arm switch and the lower bridge arm switch are turned on in turn, the second end of the power conversion circuit outputs a square wave.

In the power conversion circuit, by controlling the on and off of the two switching circuits respectively, the conversion of direct current power supply into a square wave power supply is realized. The stability of the driving circuit ensures the stability of the switching circuit and the power conversion circuit, thereby ensuring a precise and stable operation of an external circuit of the switching circuit and the power conversion circuit.

After considering the description and practicing the application disclosed herein, those skilled in the art will easily think of other embodiments of the present application. The present application is intended to cover any variations, uses, or adaptive changes of the present application, which follow the general principles of the present application and include common knowledge or customary technical means in the present technical field that are not disclosed in the present application. The description and the embodiments are only regarded as illustrative, and the true scope and spirit of the present application are pointed out by the following claims.

It should be understood that the present application is not limited to the precise structure that has been described above and illustrated in the accompanying drawings, and various modifications and changes may be made without departing from its scope. The scope of the present application is only limited by the appended claims.

What is claimed is:

1. A driving circuit of power devices, wherein the driving circuit is configured to control switching actions of N power devices (14), wherein N≥2 and N is a positive integer, each of the power devices (14) is provided with a first end (142), a second end (143) and a control end (141), first ends of the N power devices are electrically connected to a first node, and second ends of the N power devices are electrically connected to a second node; and the driving circuit comprises:
   a driving input circuit (15), wherein the driving input circuit (15) is provided with a first end (151) and a second end (152); and
   a common magnetic bead (13), wherein the common magnetic bead (13) is provided with N first ends (131) and N second ends (132);
   wherein a first end (151) of the driving input circuit (15) is electrically connected to the N first ends (131) of the common magnetic bead (13), the N second ends (132) of the common magnetic bead (13) are electrically connected to control ends (141) of the N power devices (14) in a one-to-one correspondence, and the second end (152) of the driving input circuit (15) is electrically connected to second ends of the N power devices;
   wherein the common magnetic bead (13) comprises a magnetic core and N coils;
   all the N coils are wound on the magnetic core, and first ends of the N coils are used as the N first ends (131) of the common magnetic bead (13), second ends of the N coils are used as the N second ends (132) of the common magnetic bead (13);
   wherein the N coils pass through the magnetic core from the first ends to the second ends in a same winding manner, and ends of the N coils with a same polarity are located on a same side of the magnetic core, and the N coils form a positive magnetic coupling relationship when the driving circuit is working; and
   parasitic inductance introduced by the common magnetic bead (13) is same for the control ends (141) of the N power devices (14).

2. The driving circuit according to claim 1, wherein each of the coils has a same number of turns on the magnetic core, and the coils are formed by a wire or a copper foil on a printed circuit board (PCB).

3. The driving circuit according to claim 1, wherein a power device (14) comprises a metal-oxide-semiconductor field-effect transistor (MOSFET), a silicon carbide metal-oxide-semiconductor field-effect transistor (SiC MOSFET), or a gallium nitride (GaN) transistor.

4. The driving circuit according to claim 1, wherein the driving circuit further comprises a transient diode (D), and a first end of the transient diode (D) is electrically connected to the first end (151) of the driving input circuit (15), and a second end of the transient diode (D) is electrically connected to the second end (152) of the driving input circuit (15).

5. The driving circuit according to claim 1, wherein each of the power devices (14) further comprises a Kelvin source (146), and the second end of the driving input circuit is electrically connected to the second ends (143) of the N power devices through the Kelvin source (146).

6. The driving circuit according to claim 1, wherein the driving circuit further comprises an impedance circuit, and the impedance circuit is electrically connected between the driving input circuit and the N power devices.

7. The driving circuit according to claim 6, wherein the impedance circuit comprises N first impedance circuits (11), and each of the first impedance circuits (11) is provided with a first end (111) and a second end (112);
   wherein, the first end (151) of the driving input circuit (15) is electrically connected to second ends (112) of the N first impedance circuits (11), first ends (111) of the N first impedance circuits (11) are electrically connected to the N first ends (131) of the common magnetic bead (13) in a one-to-one correspondence, the N second ends (132) of the common magnetic bead (13) are used as first driving ends of the driving circuit, for electrically connecting to the control ends (141) of the N power devices (14) in a one-to-one correspondence; or
   the first end (151) of the driving input circuit (15) is electrically connected to the N first ends (131) of the common magnetic bead (13), the N second ends (132) of the common magnetic bead (13) are electrically connected to N second ends (112) of the first impedance circuit (11) in a one-to-one correspondence, N first ends (111) of the first impedance circuit (11) are used as first driving ends of the driving circuit, for electrically connecting to the control ends (141) of the N power devices (14) in a one-to-one correspondence.

8. The driving circuit according to claim 7, wherein the impedance circuit comprises N second impedance circuits (12), and each of the second impedance circuits (12) is provided with a first end (121) and a second end (122);
   wherein the second end (152) of the driving input circuit (15) is electrically connected to second ends (122) of the N second impedance circuits (12), first ends (121) of the N second impedance circuits are used as second driving ends of the driving circuit, for electrically connecting to second ends (143) of the N power devices (14) in a one-to-one correspondence.

9. The driving circuit according to claim 7, wherein the N first impedance circuits (11) have a same circuit structure and a same electrical parameter.

10. The driving circuit according to claim 6, wherein the impedance circuit comprises N second impedance circuits (12), and each of the second impedance circuits (12) is provided with a first end (121) and a second end (122);

wherein the second end (152) of the driving input circuit (15) is electrically connected to second ends (122) of the N second impedance circuits (12), first ends (121) of the N second impedance circuits are used as second driving ends of the driving circuit, for electrically connecting to second ends (143) of the N power devices (14) in a one-to-one correspondence.

11. The driving circuit according to claim 10, wherein the N second impedance circuits (12) have a same circuit structure and a same electrical parameter.

12. The driving circuit according to claim 1, wherein the driving input circuit (15) comprises a power supply;

wherein a first end of the power supply is used as the first end (151) of the driving input circuit (15), and a second end of the power supply is used as the second end (152) of the driving input circuit (15).

13. The driving circuit according to claim 12, wherein the driving input circuit (15) further comprises an isolation unit;

wherein an input side of the isolation unit is electrically connected to the power supply, an end of an output side of the isolation unit is used as the first end (151) of the driving input circuit, and another end of the output side of the isolation unit is used as the second end (152) of the driving input circuit (15).

14. The driving circuit according to claim 13, wherein the isolation unit comprises: a transformer, an optocoupler isolation unit, or an optical fiber isolation unit;

wherein a primary winding of the transformer is electrically connected to the power supply, a first end of a secondary winding of the transformer is used as the first end (151) of the driving input circuit (15), and a second end of the secondary side of the transformer is used as the second end (152) of the driving input circuit (15).

15. The driving circuit according to claim 1, wherein the driving input circuit (15) comprises N power supplies;

wherein first ends of the N power supplies are used as N first ends (151) of the driving input circuit (15) to electrically connect to the control ends of the N power devices in a one-to-one correspondence, second ends of the N power supplies are used as N second ends (152) of the driving input circuit (15) and are electrically connected to a same node and then electrically connected to the second ends of the N power devices;

wherein output voltages of the N power supplies have a same amplitude and a same frequency.

16. The driving circuit according to claim 15, wherein the driving input circuit (15) further comprises an isolation unit;

wherein an input side of the isolation unit is electrically connected to the power supply, an end of an output side of the isolation unit is used as the first end (151) of the driving input circuit, and another end of the output side of the isolation unit is used as the second end (152) of the driving input circuit (15).

17. The driving circuit according to claim 16, wherein the isolation unit comprises: a transformer, an optocoupler isolation unit, or an optical fiber isolation unit;

wherein a primary winding of the transformer is electrically connected to the power supply, a first end of a secondary winding of the transformer is used as the first end (151) of the driving input circuit (15), and a second end of the secondary side of the transformer is used as the second end (152) of the driving input circuit (15).

18. A switching circuit, comprising a driving circuit according to claim 1 and the N power devices (14), wherein N≥2 and N is a positive integer;

wherein the driving circuit is configured to control switching actions of the N power devices; and first ends (142) of the N power devices (14) are electrically connected to a first node to form a first end of the switching circuit, and second ends (143) of the N power devices (14) are electrically connected to a second node to form a second end of the switching circuit.

19. A power conversion circuit, comprising an input capacitor, a first switching circuit and a second switching circuit, wherein both the first switching circuit and the second switching circuit are a switching circuit according to claim 18;

wherein a first end of the first switching circuit is electrically connected to a first end of the input capacitor, a second end of the first switching circuit is electrically connected to a first end of the second switching circuit, and a second end of the second switching circuit is electrically connected to a second end of the input capacitor.

* * * * *